(12) United States Patent
Chow et al.

(10) Patent No.: US 7,649,255 B2
(45) Date of Patent: Jan. 19, 2010

(54) DETERMINING CHIP SEPARATION BY COMPARING COUPLING CAPACITANCES

(75) Inventors: Alex Chow, East Palo Alto, CA (US); Robert D. Hopkins, Hayward, CA (US); Justin M. Schauer, Palo Alto, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 300 days.

(21) Appl. No.: 11/635,336

(22) Filed: Dec. 6, 2006

(65) Prior Publication Data

US 2008/0136424 A1 Jun. 12, 2008

(51) Int. Cl.
*H01L 23/34* (2006.01)
*H01L 23/48* (2006.01)

(52) U.S. Cl. .................. 257/723; 257/773; 257/786; 257/777; 257/E23.144; 438/14; 438/381

(58) Field of Classification Search .................. 257/773, 257/786, 723, 777, E23.144; 438/14, 381
See application file for complete search history.

(56) References Cited

U.S. PATENT DOCUMENTS

| | | | |
|---|---|---|---|
| 6,191,479 B1 * | 2/2001 | Herrell et al. .............. 257/724 |
| 6,198,635 B1 * | 3/2001 | Shenoy et al. .............. 361/760 |
| 6,448,098 B1 * | 9/2002 | Milor ......................... 438/17 |
| 6,891,447 B2 * | 5/2005 | Song ....................... 333/24 R |
| 6,916,719 B1 * | 7/2005 | Knight et al. .............. 438/381 |
| 7,161,175 B2 * | 1/2007 | Shau ......................... 257/48 |
| 7,425,836 B2 * | 9/2008 | Chow et al. ................ 324/681 |
| 2004/0095201 A1 * | 5/2004 | Song ....................... 333/24 R |

* cited by examiner

*Primary Examiner*—Nitin Parekh
(74) *Attorney, Agent, or Firm*—Park, Vaughan & Fleming LLP

(57) ABSTRACT

A semiconductor die includes proximity connectors proximate to a surface of the semiconductor die. This semiconductor die is configured to communicate signals with another semiconductor die via proximity communication through one or more of the proximity connectors. In particular, the proximity connectors include a first group of proximity connectors that is configured to facilitate determining a first separation between the semiconductor die and the other semiconductor die by comparing coupling capacitances between the semiconductor die and the other semiconductor die. Note that the first group of proximity connectors includes a first proximity connector and a second proximity connector, and the second proximity connector at least partially encloses an in-plane outer edge of the first proximity connector.

19 Claims, 14 Drawing Sheets

DETERMINING CHIP SEPARATION BY COMPARING COUPLING CAPACITANCES

GOVERNMENT LICENSE RIGHTS

This invention was made with United States Government support under Contract No. NBCH3039002 awarded by the Defense Advanced Research Projects Administration. The United States Government has certain rights in the invention.

BACKGROUND

1. Field of the Invention

The present invention relates to techniques for communicating signals between semiconductor dies. More specifically, the present invention relates to a method and an apparatus for determining misalignment between semiconductor dies by comparing coupling capacitances in different capacitive connections between the semiconductor dies.

2. Related Art

Advances in semiconductor technology presently make it possible to integrate large-scale systems, which can include tens of millions of transistors, into a single semiconductor chip. Integrating such large-scale systems onto a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

Unfortunately, these advances in semiconductor technology have not been matched by corresponding advances in inter-chip communication technology. Semiconductor chips are typically integrated onto a printed circuit board that contains multiple layers of signal lines for inter-chip communication. However, signal lines on a semiconductor chip are about 100 times more densely packed than signal lines on a printed circuit board. Consequently, only a tiny fraction of the signal lines on a semiconductor chip can be routed across the printed circuit board to other chips. This problem has created a bottleneck that continues to grow as semiconductor integration densities continue to increase.

Researchers have begun to investigate alternative techniques for communicating between semiconductor chips. One promising technique involves integrating arrays of capacitive transmitters and receivers onto semiconductor chips to facilitate inter-chip communication. If a first chip is situated face-to-face with a second chip so that transmitter pads on the first chip are capacitively coupled with receiver pads on the second chip, the first chip can directly transmit signals to the second chip without having to route the signals through intervening signal lines within a printed circuit board.

Capacitive coupling requires precise alignment between the transmitter pads and the receiver pads, both in a plane defined by the pads and in a direction perpendicular to the plane. Misalignment between the transmitter pads and the receiver pads may cause each receiving pad to span two transmitting pads, thereby destroying a received signal. In theory, for communication to be possible chips must be aligned so that misalignment is less than half of a pitch between the pads. In practice, the alignment requirements may be more stringent. In addition, reducing misalignment can improve communication performance between the chips and reduce power consumption.

Unfortunately, it can be very challenging to align chips properly. Existing approaches include mechanical mounting structures that facilitate self-alignment and/or self-adjustment of pad positions. However, because of thermal expansion and mechanical vibrations, as well as manufacturing and assembly perturbations, even if the systems are assembled very carefully chips often still have some residual misalignment. Other techniques such as electronic steering, in which data signals are routed to particular pads in an array of pads, may also be used to further reduce the effects of misalignment. However, in order for the above-described techniques to work it is first necessary to precisely measure the alignment between chips.

One existing alignment measurement technique assigns a charge to conducting pads on one chip, and detects a pattern of charges that are induced in the pads on a facing chip. A variation on this technique provides an array of conductive pads on the first chip and an array of conductive pads on the second chip with a different spacing or pitch than the conductive pads on the first chip. When the conductive pads on the first chip overlap with the conductive pads on the second chip, a Vernier structure is created, which allows the alignment between the chips to be determined.

Another existing measurement technique determines chip separation. In this technique, a periodic signal is applied to conducting pads on one chip, and the charges induced on the pads on a facing chip are rectified. The coupling capacitance may be calculated from the amplitude of the resulting rectified current, and the chip separation may be determined from the coupling capacitance.

However, these existing approaches have limitations. These techniques are complex and measurements performed using these techniques are often slow. Moreover, results may be inaccurate, especially for small misalignments, since these techniques rely on being able to detect very small changes in capacitance for each pad. Unfortunately, because of noise and other instrument limitations, such as transistor leakage, it is often not possible to accurately detect such small changes in capacitance using these techniques.

Hence what is needed is a method and an apparatus to determine misalignment and facilitate capacitive inter-chip communication without the problems listed above.

SUMMARY

One embodiment of the present invention provides a semiconductor die that includes proximity connectors proximate to a surface of the semiconductor die. This semiconductor die is configured to communicate signals with another semiconductor die via proximity communication through one or more of the proximity connectors. In particular, the proximity connectors include a first group of proximity connectors that is configured to facilitate determining a first separation between the semiconductor die and the other semiconductor die by comparing coupling capacitances between the semiconductor die and the other semiconductor die. Note that the first group of proximity connectors includes a first proximity connector and a second proximity connector, and the second proximity connector at least partially encloses an in-plane outer edge of the first proximity connector.

In some embodiments, the first proximity connector and the second proximity connector are separated by a guard band. Furthermore, in some embodiments the second proximity connector has a ring shape, and an in-plane inner edge associated with the ring shape encloses the in-plane outer edge of the first proximity connector.

In some embodiments, the first group of proximity connectors are configured to transmit communication signals and/or to receive communication signals.

In some embodiments, the first separation is determined based on a difference in capacitance between a first capacitance associated with the first proximity connector and a second capacitance associated with the second proximity connector. Furthermore, in some embodiments the first separation is determined based on a sign of the difference in capacitance.

In some embodiments, the first proximity connector is in a first plane and the second proximity connector is in a second plane. Furthermore, in some embodiments the first proximity connector has a first area and the second proximity connector has a second area. And in some embodiments the first proximity connector is associated with a first dielectric in the semiconductor die and/or the second proximity connector is associated with a second dielectric in the semiconductor die.

In some embodiments, the semiconductor die is configured to dynamically select the first group of proximity connectors. For example, the first proximity connector and/or the second proximity connector in the first group of proximity connectors may be dynamically selected to have an area corresponding to the first separation.

In some embodiments, the proximity connectors include a second group of proximity connectors that is configured to facilitate determining a second separation between the semiconductor die and the other semiconductor die by comparing coupling capacitances between the semiconductor die and the other semiconductor die. Note that the second group of proximity connectors may include a third proximity connector and a fourth proximity connector, and the fourth proximity connector may at least partially enclose an in-plane outer edge of the third proximity connector.

In some embodiments, the first separation is in a first range of values and the second separation is in a second range of values. Furthermore, in some embodiments a tilt angle of the semiconductor die is determined based on the first separation and the second separation.

In some embodiments, a subset of the proximity connectors is configured to facilitate determining translation and/or a rotation of the semiconductor die with respect to the other semiconductor die.

Another embodiment of the present invention provides a system that includes the semiconductor die and the other semiconductor die.

Another embodiment of the present invention provides a method for determining the first separation between the semiconductor die and the other semiconductor die. This method operates by selecting the first group of proximity connectors, wherein the first group of proximity connectors has a first area. Next, the sign of the difference in capacitance between the first group of proximity connectors and a third group of proximity connectors in the other semiconductor die is measured. Then, the first separation is determined by selecting different groups of proximity connectors that have areas that are different than the first area until the sign of the difference in capacitance changes polarity.

BRIEF DESCRIPTION OF THE FIGURES

Note that like reference numerals refer to corresponding parts throughout the drawings.

DETAILED DESCRIPTION

Figure 1:
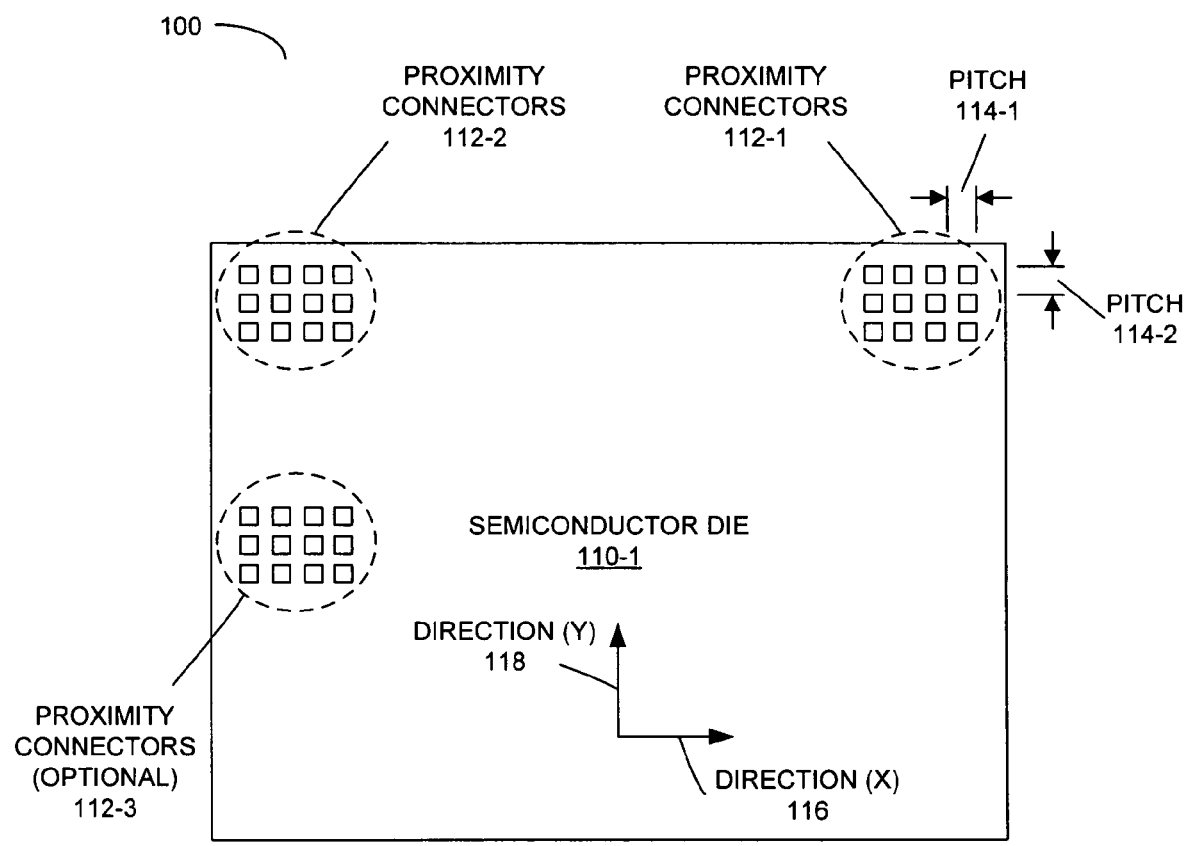
FIG. 1 is a block diagram illustrating a device that includes proximity connectors in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a device, systems that include the device, and a method are described. Note that the device may be a semiconductor die that includes one or more integrated circuits. This semiconductor die may be configured to communicate with one or more other semiconductor dies by proximity communication via capacitive-coupled signals, magnetically-coupled signals, and/or optical signals. For example, the semiconductor die may include proximity connectors proximate to a surface of the semiconductor die (i.e., the proximity connectors may be on, beneath, or coupled to the surface).

To facilitate proximity communication with the other semiconductor dies, one or more groups of proximity connectors may be configured to facilitate determining one or more components of the misalignment between the semiconductor dies (such as separation(s) at one or more locations) by comparing coupling capacitances between the semiconductor dies. In particular, a separation may be determined based on a difference in capacitance between two or more capacitances in one of the groups of proximity connectors. Furthermore, in some embodiments the separation is determined based on a sign of the difference in capacitance.

In an exemplary embodiment, a group of proximity connectors includes at least two proximity connectors. One of these proximity connectors may have a ring shape that encloses an in-plane outer edge of the other proximity connector. Note that these proximity connectors may transmit and/or receive communication signals, and the communication signals may be static (i.e., time independent) and/or dynamic. Furthermore, in some embodiments the group of proximity connectors may be dynamically selected from a set of proximity connectors based on the separation to be determined. For example, the area of the group of proximity connectors may be chosen to correspond to the separation. Thus, depending on the separation a different group of proximity connectors may be used.

Measurements of separation may be performed with varying frequencies. For example, separation may be measured: once; intermittently (such as during a calibration mode of operation); at times separated by intervals (which may be variable and/or fixed); and/or continuously. In one embodiment of the present invention, if a metric of communication performance (such as a signal magnitude, a mean square error, and/or a bit-error rate) degrades, one of the semiconductor dies may enter a calibration mode of operation based on instructions executed by control logic to recalibrate the separation.

The measured separation(s) may allow one or more components of the misalignment between the semiconductor dies to be determined. Note that the determined misalignment may be used to steer electrical signals in one or more of the semiconductor dies to given proximity connectors thereby facilitating proximity communication between the semiconductor dies.

Note that the one or more groups of proximity connectors may enable more accurate and/or faster determination of one or more components of the misalignment between the semiconductor dies (such as the separation and/or a tilt angle) than the proximity-connector configurations used in existing devices and systems. In particular, differences in capacitance that are associated with the one or more groups of proximity connectors may be measured using differential detection circuits that are significantly less sensitive to leakage currents. As a consequence, the resulting measurements may also have higher sensitivity. Furthermore, binary decisions based on such comparisons may be easier to implement than measurements of very small capacitances.

We now describe embodiments of devices and systems that include proximity communication. FIG. 1 provides a block diagram illustrating a device 100 that includes proximity connectors or pads 112 in accordance with an embodiment of the present invention. Device 100 may include at least one semiconductor die 110, wherein semiconductor die 110 may include integrated circuit electronics corresponding to layers deposited on a semiconductor substrate. Note that semiconductor die 110 may be packaged in a single-chip module (SCM) and/or a multi-chip module (MCM), wherein the MCM may include two or more SCMs. When packaged, for example in the SCM or the MCM, the one semiconductor die 110 is sometimes referred to as a "chip."

In one embodiment, the proximity connectors 112 may be on or proximate to at least one surface of the semiconductor die 110, the SCM and/or the MCM. In other embodiments, the semiconductor die 110, the SCM and/or the MCM may be coupled to the proximity connectors 112. In an exemplary embodiment, arrays of proximity connectors 112 are substantially located at or near one or more corners (proximity connectors 112-1 and 112-2) and/or edges (proximity connectors 112-3) of the semiconductor die 110. In other embodiments, proximity connectors 112 may be situated at one or more arbitrary locations on, or proximate to, the surface of the semiconductor die 110.

As illustrated for the proximity connectors 112-1, there is a first pitch 114-1 between adjacent connectors or pads in a first direction (X) 116 of the surface and a second pitch 114-2 between adjacent connectors or pads in a second direction (Y) 118 of the surface. In some embodiments, the first pitch 114-1 and the second pitch 114-2 are approximately equal.

Figure 2:
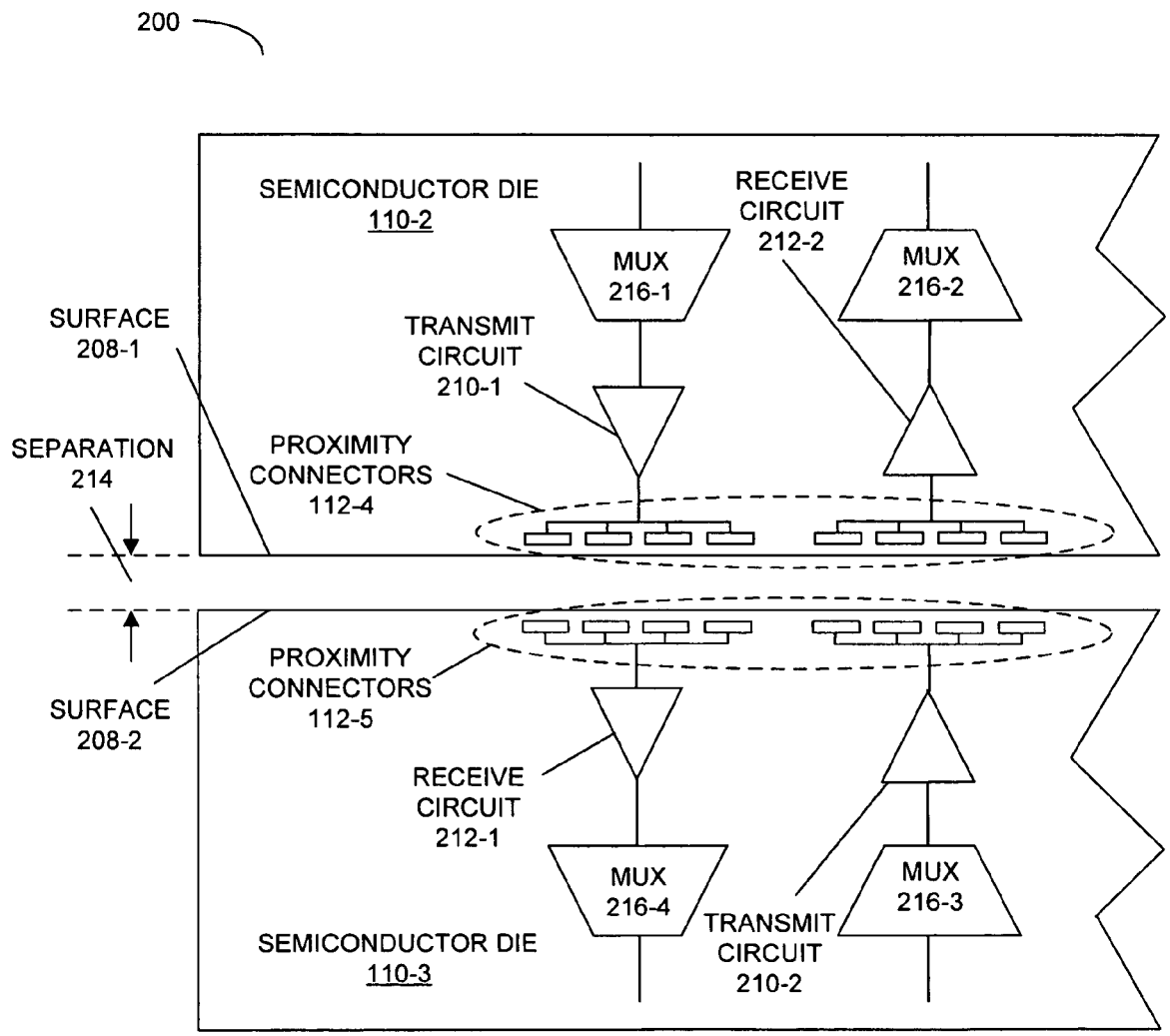
FIG. 2 is a block diagram illustrating a system that includes semiconductor dies that communicate using proximity communication in accordance with an embodiment of the present invention.

FIG. 2 provides a block diagram illustrating a system 200 that includes semiconductor dies 110 that communicate using proximity communication in accordance with an embodiment of the present invention. The devices 110 may include proximity connectors 112 that are on or proximate to at least respective surfaces 208 of the semiconductor dies 110. For example, the plurality of proximity connectors 112 may be situated beneath protective layers such that they are located below the surfaces 208. Moreover, subsets of the proximity connectors 112 may be coupled to transmit circuits 210 (such as transmit drivers) and receive circuits 212 (such as receivers). One of the transmit circuits 210, at least a subset of the proximity connectors 112 on the adjacent semiconductor dies 110, and one of the receive circuits 212 may constitute a communication channel. For example, the communication channel may include transmit circuit 210-1, some of the proximity connectors 112, and receive circuit 212-1. Note that transmit circuits 210 and receive circuits 212 may utilize current-mode signaling (i.e., current-mode drivers and receivers) and/or voltage-mode signaling (i.e., voltage-mode drivers and receivers). Furthermore, semiconductor dies 110 may also include wiring and electronics (not shown) to relay the data signals to additional electronics on the semiconductor dies 110, such as logic and memory.

In order to communicate data signals using proximity communication, transmit and receive proximity connectors 112 on adjacent semiconductor dies 110 may have, at worst, only limited misalignment, i.e., substantially accurate alignment. For densely packed proximity connectors, i.e., proximity connectors 112 having a small spacing or pitch 114 (FIG. 1) between adjacent pads, the alignment between two or more proximity connectors 112 on adjacent semiconductor dies 110 may be within a few microns in the first direction (X) 116 (FIG. 1) and/or a few microns in the second direction (Y) 118 (FIG. 1) in a first plane including at least some of the proximity connectors 112, and/or within a few microns in a third direction (Z) approximately perpendicular to the first plane. The system 200 illustrates a separation 214 in the third direction (Z).

In some embodiments, the proximity connectors 112 may be aligned in six degrees of freedom, including the first direction (X) 116 (FIG. 1), the second direction (Y) 118 (FIG. 1), the third direction (Z), an angle in the first plane defined by the first direction (X) 116 (FIG. 1) and the second direction (Y) 118 (FIG. 1), an angle in a second plane defined by the first direction (X) 116 (FIG. 1) and the third direction (Z), and an angle in a third plane defined by the second direction (Y) 118 (FIG. 1) and the third direction (Z). (Misalignments associated with these six degrees of freedom are described further below with reference to FIGS. 3A-3E.) Note that if a surface, such as the surface 208-1, of either of the adjacent semiconductor dies 110 is non-planar (for example, due to quadrupole distortion), additional alignment problems may be introduced.

In some embodiments, the allowed misalignment in the first direction (X) 116 (FIG. 1), the second direction (Y) 118 (FIG. 1) and/or the third direction (Z) is less than one half of the pitch 114 (FIG. 1) between adjacent proximity connectors 112. For example, allowed misalignment in the first direction (X) 116 (FIG. 1) and/or the second direction (Y) 118 (FIG. 1) may be less than 25 µm, and the separation 214 in the third direction (Z) may be less than 5 µm.

Mechanisms that facilitate self-alignment and/or self-adjustment of relative positions of the proximity connectors 112 on adjacent semiconductor dies 110 and/or in a component coupling two or more semiconductor dies 110 may reduce and/or eliminate the separation 214 in the third direction (Z). For example, structures that have flexibility compliance or are spring-like may be used. In other embodiments, a feedback control loop may be used to reduce and/or eliminate the separation 214 in the third direction (Z).

Reducing or eliminating the separation 214, in turn, may lead to at least partial overlap of one or more proximity connectors 112 on the adjacent semiconductor dies 110 and may increase the magnitude of the capacitively-coupled data signals. In addition, the solutions may reduce misalignment in the first plane, i.e., the plane including at least some of the proximity connectors 112, when used in conjunction with techniques such as electronic steering, in which data signals are routed to respective proximity connectors 112 in accordance with the alignment in the first plane. (Note that steering mechanisms, such as multiplexers 216, may be included in or proximate to the arrays of proximity connectors 112 in order to facilitate such electronic steering in one or more of the semiconductor dies 110). As a consequence, these solutions may facilitate proximity communication between the semiconductor dies 110, SCMs and/or MCMs. The solutions may also reduce and/or eliminate a need for narrow tolerances, precise manufacturing, and/or precise assembly of the semiconductor dies 110, the SCM and/or the MCM.

In the embodiments described above and below, the proximity connectors 112 on the adjacent semiconductor dies 110 utilize capacitive coupling and/or a number of data signal channels for inter-chip communication. In other embodiments, additional connectors may be overlapped on adjacent semiconductor dies 110.

While the description below uses capacitively coupled proximity connectors as an illustration, one embodiment of the present invention uses magnetic proximity connectors, where data signals are communicated magnetically (inductive communication) between terminals on close adjacent semiconductor dies 110. Another embodiment uses optical proximity connectors, where data signals are communicated optically between terminals (which may include optical emitters, detectors, and/or gratings) on adjacent semiconductor dies 110. Yet another embodiment couples connectors in adjacent semiconductor dies 110, for example, by using an array of solder balls (conductive communication).

Note that while the device 100 (FIG. 1) and the system 200 are illustrated as having a number of components in a given configuration, in other embodiments device 100 (FIG. 1) and/or system 200 may include fewer components or additional components, two or more components may be combined into a single component, and/or a position of one or more components may be changed.

As noted previously, in order to facilitate proximity communication the proximity connectors 112 may be aligned in six degrees of freedom. To accomplish this, misalignment associated with these degrees of freedom may be measured. Illustrations of the various components of the misalignment between semiconductor dies 310 are provided in embodiments 300, 330, 340, 350, and 360 in FIGS. 3A-3E. Embodiment 300 illustrates separation 314 (which corresponds to the separation 214 in the third direction (Z) in FIG. 2) and in-plane translation 312-1 along direction (X) 116 (FIG. 1). Another in-plane translation 312-2 along direction (Y) 118 (FIG. 1) is illustrated in embodiment 330. Rotation or tilt angle 316-1 in the second plane defined by the first direction (X) 116 (FIG. 1) and the third direction (Z) is illustrated in embodiments 340, and rotation or tilt angle 316-2 in the third plane defined by the second direction (Y) 118 (FIG. 1) and the third direction (Z) is illustrated in embodiments 350. Finally, rotation 320 in the first plane defined by the first direction (X) 116 (FIG. 1) and the second direction (Y) 118 (FIG. 1) is illustrated in embodiment 360.

We now describe embodiments of proximity-connector structures that facilitate determining one or more components of the misalignment. While the misalignment in all six degrees of freedom may be determined, the configurations and techniques described below are well suited to determining misalignment due to separation and/or a tilt angle. These configurations and techniques may be combined with other approaches, such as the Vernier structure described below with reference to FIG. 10, to determine the relative position and orientation of a semiconductor die in space.

Figure 4A:
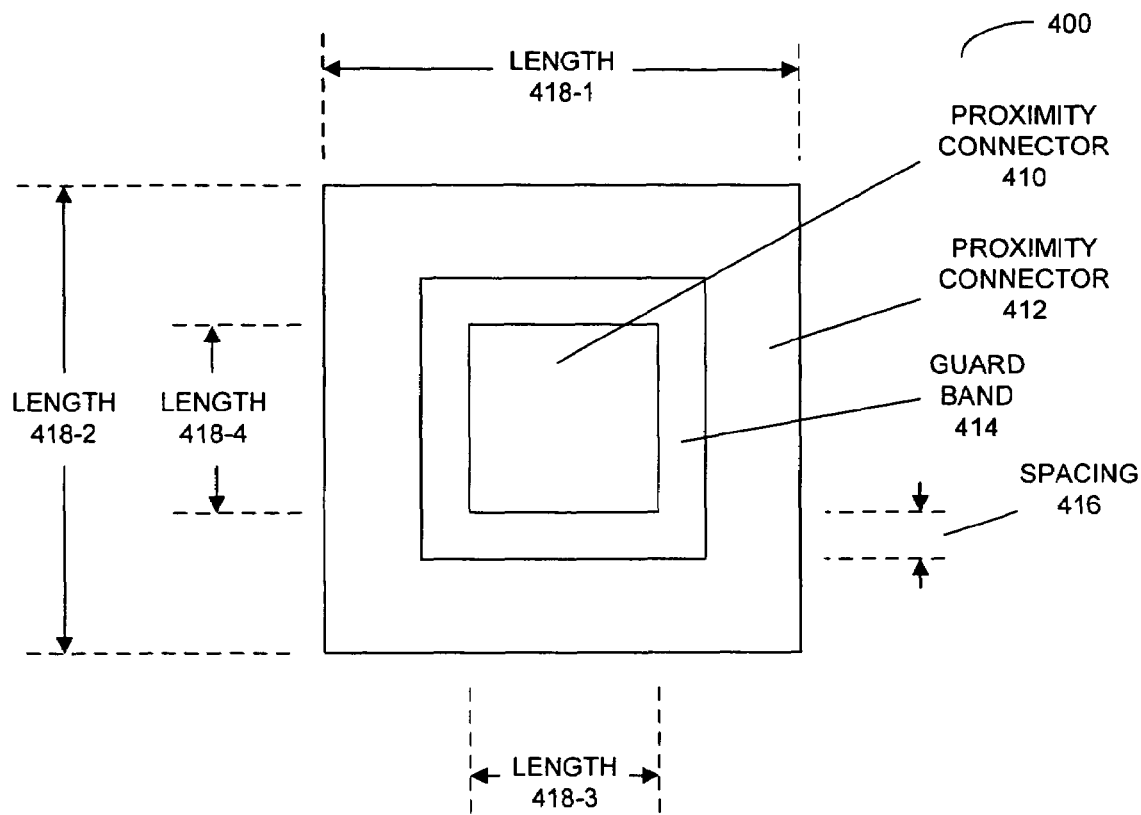
FIG. 4A is a block diagram illustrating a first portion of a proximity-connector structure that facilitates determining misalignment in accordance with an embodiment of the present invention.
Figure 4B:
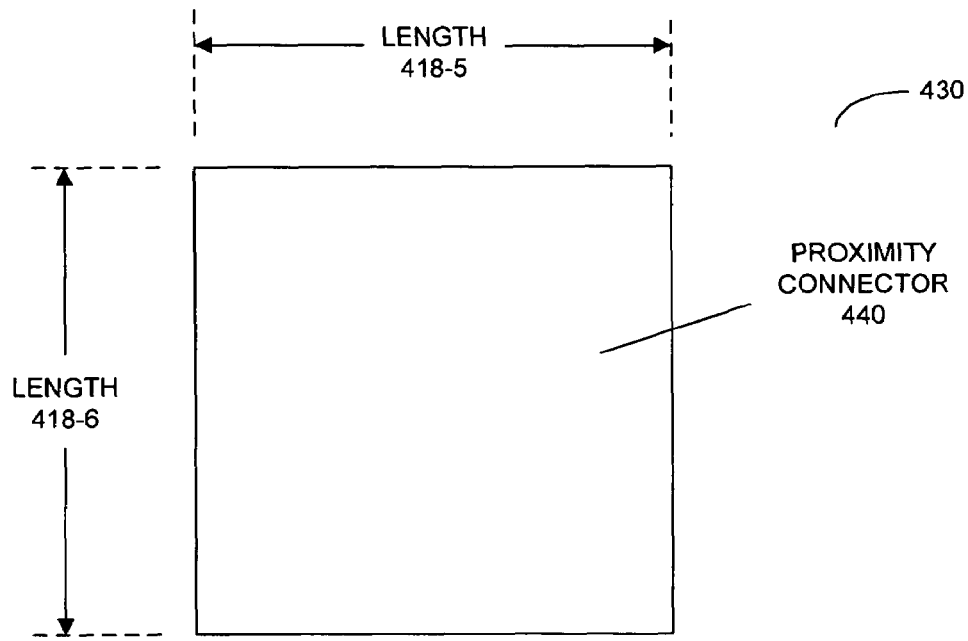
FIG. 4B is a block diagram illustrating a second portion of a proximity-connector structure that facilitates determining misalignment in accordance with an embodiment of the present invention.

FIGS. 4A and 4B provide block diagrams illustrating top views of portions 400 and 430 of a proximity-connector structure that facilitates determining misalignment in accordance with an embodiment of the present invention. For example, the portion 400 of the proximity-connector structure may be included in a first semiconductor die that is communicating with the portion 430 of the proximity-connector structure in a second semiconductor die. A given semiconductor die may include one or more instances of either portion 400 and/or portion 430. These instances may be at separate locations in the semiconductor die. Furthermore, the portions 400 and/or 430 may be included in one or more arrays of proximity connectors in semiconductor dies (such as the proximity connectors 112-2 in FIG. 1) and/or may be separate from other arrays of proximity connectors in semiconductor dies. Note that either of the portions 400 and 430 may be used to transmit and/or to receive communication signals with the other portion, and these communication signals may be static and/or dynamic.

Each portion of the proximity-connector structure may include a group or set of proximity connectors. This group or set may include one or more proximity connectors. Portion 400 includes two proximity connectors. An outer proximity connector 412 fully encloses an inner proximity connector 410 when viewed along the third direction (Z). However, note that in other embodiments the outer proximity connector 412 only partially encloses the inner proximity connector 410. These proximity connectors are separated by a spacing 416 that is provided by a guard band 414. Note that the proximity connectors each have an associated area. In particular, proximity connector 410 has an area equal to the product of length 418-3 and 418-4, and proximity connector 412 has an area equal to length 418-1 minus length 418-3 and minus the spacing 416 times length 418-2 minus length 418-4 and minus the spacing 416. Furthermore, an upper bound on the area of the portion 400 of the proximity-connector structure is the product of length 418-1 and 418-2. As discussed further below, in some embodiments this area corresponds to the separation between semiconductor dies (i.e., is proportional to the separation) that is to be determined.

In contrast with portion 400, portion 430 is illustrated as having a single proximity connector 430 having an area equal to the product of length 418-5 and 418-6. However, either of the portions 400 and 430 may include one or more additional proximity connectors, such as another outer proximity connector.

The proximity-connector structure illustrated in FIGS. 4A and 4B may be used to facilitate determining one or more separations between semiconductor dies. In particular, one or more separations may be determined from the difference in capacitance between the proximity connectors 440 and 410 and proximity connectors 440 and 412. In an exemplary embodiment, the sign of the difference in capacitance is used to determine the separation.

Note that while the portions 400 and 430 of the proximity-connector structure are illustrated as having a number of components in a given configuration, in other embodiments the portions 400 and/or 430 may include fewer components or additional components, two or more components may be combined into a single component, and/or a position of one or more components may be changed. For example, in some embodiments the proximity connectors 410 and/or 412 have an asymmetric shape about an axis of rotation of the proximity connectors 410 and/or 412.

Figure 5:
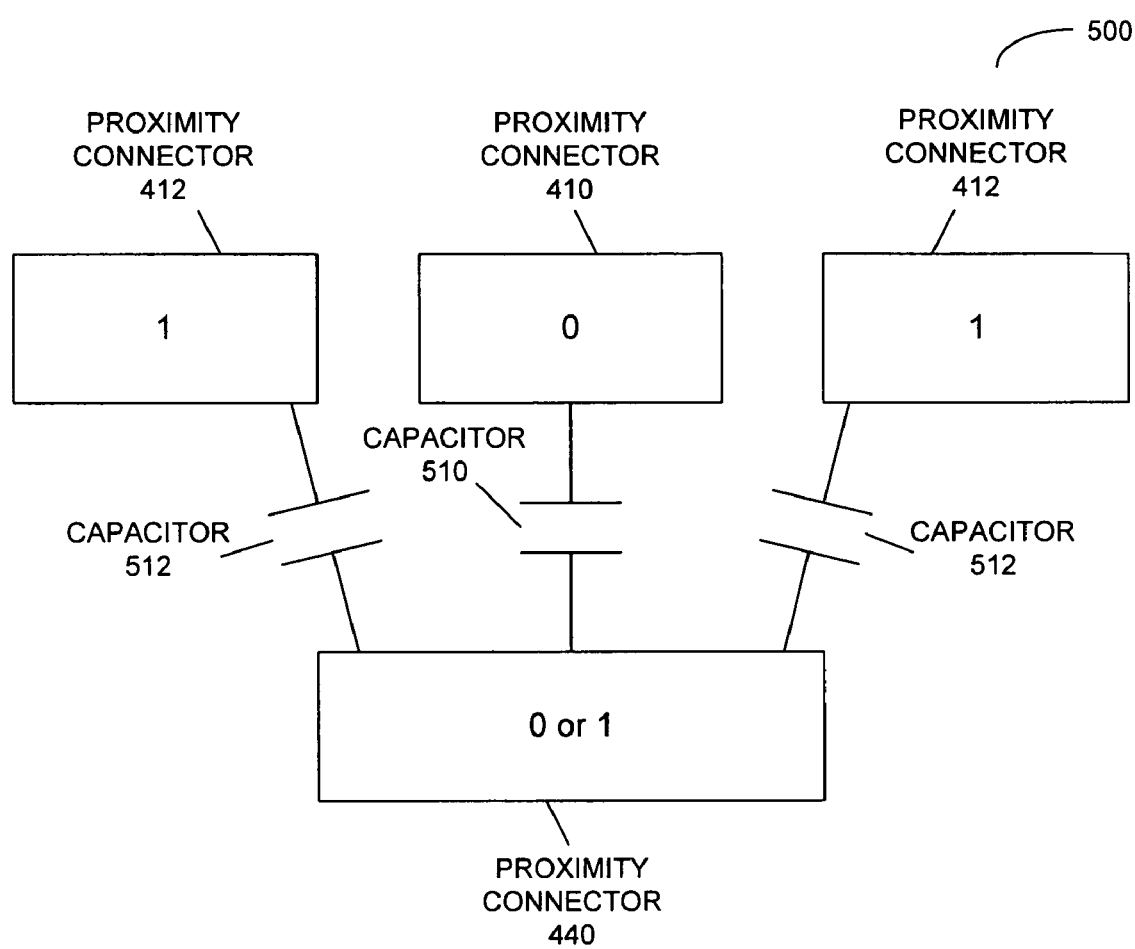
FIG. 5 is a block diagram illustrating a proximity-connector structure that facilitates determining misalignment in accordance with an embodiment of the present invention.

FIG. 5 provides a block diagram illustrating a cross-sectional view of a proximity-connector structure 500 that facilitates determining misalignment in accordance with an embodiment of the present invention. Proximity connectors 410 and 412 in the first semiconductor die are capacitively coupled to proximity connector 440 in the second semiconductor die. In particular, for a given separation between the semiconductor dies, inner proximity connector 410 is coupled to proximity connector 440 by capacitor 510 (via the gap between the semiconductor dies) and outer proximity connector 412 is coupled to proximity connector 440 by capacitor 512 (via the gap between the semiconductor dies). Note that capacitor 512 represents the capacitive coupling to the entire outer proximity connector 412.

Note that the capacitances of the capacitors 510 and 512 have a different dependence on the separation between the proximity connectors in the two semiconductor dies. In particular, the capacitance of the capacitor 512 is more dependent on fringe electric fields between the proximity connectors 412 and 440, while the capacitance of the capacitor 510 is more dependent on area coupling between the proximity connectors 410 and 440. As such, the capacitance of the capacitor 512 will decrease less rapidly as the separation increases.

When the semiconductor dies are close together (i.e., when the separation is small), if a signal corresponding to a '0' is applied to proximity connector 410 and a signal corresponding to a '1' to proximity connector 412, a signal corresponding to the '0' may be observed on the proximity connector 440 (which is a receiver in this embodiment) based on a comparison of the capacitances of the capacitors 510 and 512. However, when the semiconductor dies are far apart (i.e., when the separation is large), the proximity connector 440 may see more coupling to the outer proximity connector 412 and a signal corresponding to the '1' may be observed on the proximity connector 440. This is because fringe-field coupling to this proximity connector dominates the electric field associated with the proximity connector 410 at larger separations.

Thus, the variation in the capacitances of capacitors 510 and 512 may allow the separation between semiconductor dies to be determined. In some embodiments the cross-over separation where the capacitance of the capacitor 512 becomes greater than the capacitance of the capacitor 510 may be used to facilitate a binary decision tree. For example, an array of proximity-connector structures that each have different areas may be used in order to determine the area of the proximity-communication structure (such as the product of length 418-1 and 418-2 in FIG. 4A) where the sign of the difference in capacitance changes polarity. Alternatively, an array of proximity connectors may be dynamically configured to define proximity-connector structures that each have different areas. This is described further below with reference to FIGS. 7-9.

Note that this variation of the difference in capacitance as a function of the separation may be, at least in part, adjusted based on the design of the proximity-connector structure. In particular, the magnitude of the slope of the change in the difference in capacitance as a function of the separation may be increased, thereby increasing the sensitivity of the measurements. Degrees of freedom in the design of the proximity-connector structure include the areas of the proximity connectors 410 and 412 (FIG. 4A) and the proximity connector 440 (FIG. 4B). Furthermore, the proximity connectors 410 and 412 (FIG. 4A) may be in different planes relative to the surface of a semiconductor die and/or different dielectrics may be associated with the proximity connectors 410 and 412 (FIG. 4A). In some embodiments, the spacing 416 (FIG. 4A) and/or the relative lengths 418 of the proximity connectors 410, 412 and/or 440 (FIGS. 4A and 4B) may changed to improve the sensitivity.

Figure 6:
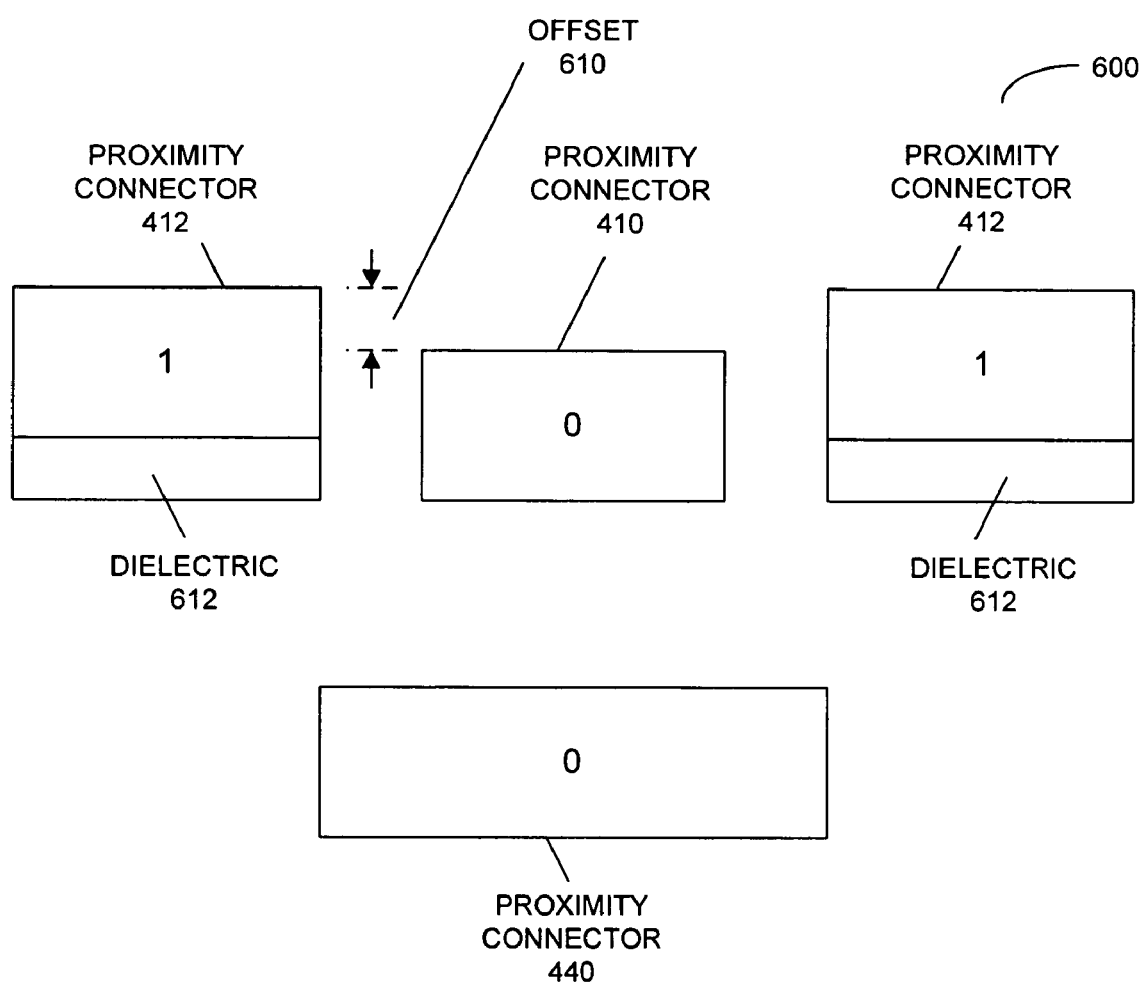
FIG. 6 is a block diagram illustrating a proximity-connector structure that facilitates determining misalignment in accordance with an embodiment of the present invention.

Some of these design alternatives are illustrated in FIG. 6, which provides a block diagram illustrating a cross-sectional view of a proximity-connector structure 600 that facilitates determining misalignment in accordance with an embodiment of the present invention. In FIG. 6, proximity connector 412 is offset 610 from proximity connector 410. As a consequence, the capacitance between the proximity connectors 412 and 440 at a given separation is reduced relative to the capacitance between the proximity connectors 410 and 440. In some embodiments, a dielectric 612 may be deposited over the proximity connector 412 to increase the capacitance between the proximity connectors 412 and 440.

Note that while the proximity-connector structures 500 and 600 are illustrated as having a number of components in a given configuration, in other embodiments the proximity-connector structures 500 and/or 600 may include fewer components or additional components, two or more components may be combined into a single component, and/or a position of one or more components may be changed. For example, in some embodiments an additional dielectric may be deposited over the proximity connectors 412 and/or 440 in the proximity-connector structure 600.

Figure 7:
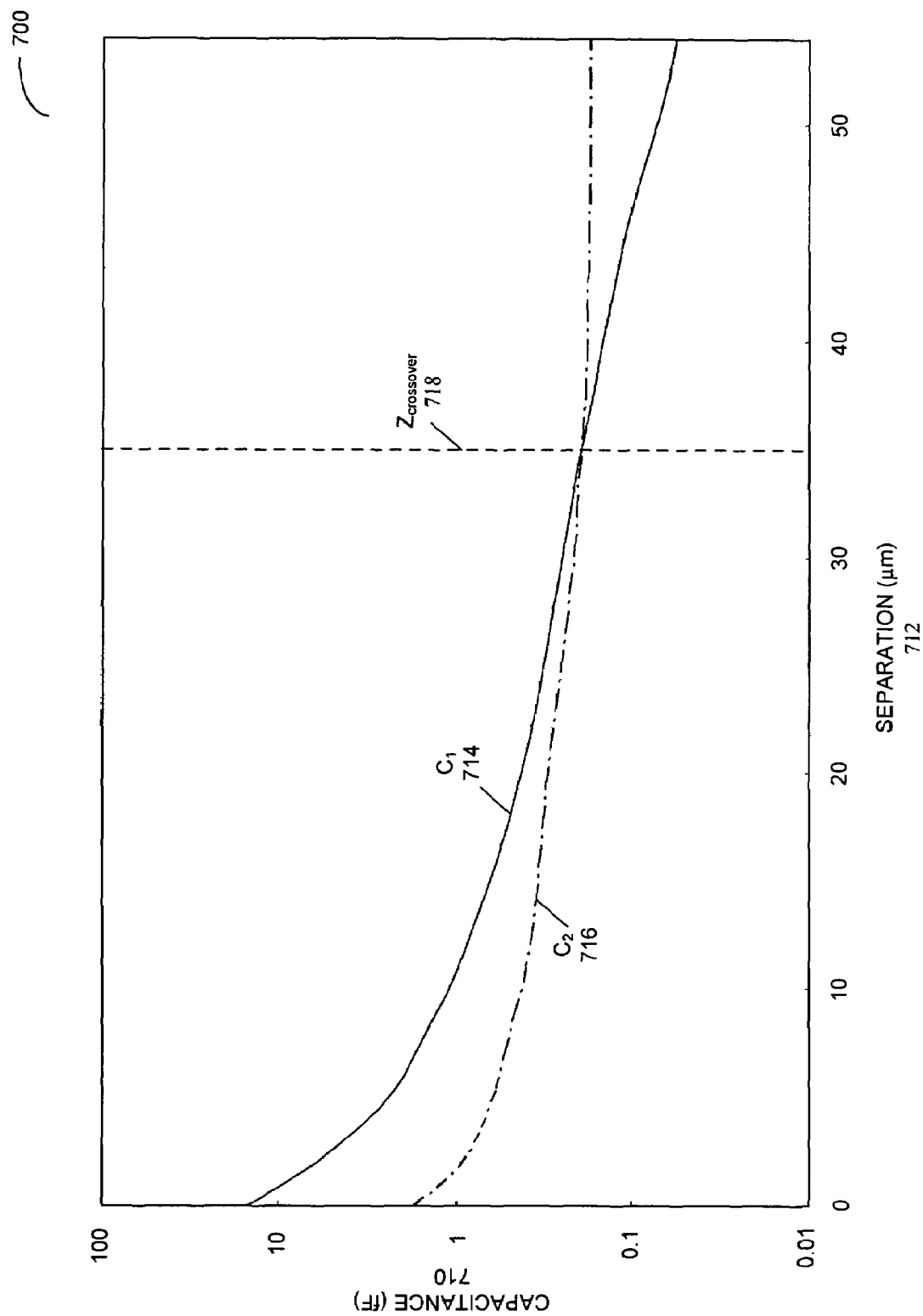
FIG. 7 is a block diagram illustrating simulated coupling capacitances as a function of separation between proximity connectors in semiconductor dies in accordance with an embodiment of the present invention.

We now describe simulations of the capacitance between proximity connectors in embodiments of proximity-connector structures. These simulations were performed using the Maxwell Field Solver™ (from Ansoft Corporation Pittsburgh, Pa.). FIG. 7 provides a block diagram illustrating simulated coupling capacitances 710 in fF as a function of separation 712 in μm between proximity connectors in semiconductor dies in accordance with an embodiment 700 of the present invention. In this embodiment, capacitance $C_1$ 714 is associated with proximity connectors 410 and 440 (FIG. 5) and capacitance $C_2$ 716 is associated with proximity connectors 412 and 440 (FIG. 5). Furthermore, the lengths 418-1 and 418-2 (FIG. 4A) are each 70 μm, the lengths 418-3 and 418-4 are each 34 μm (FIG. 4A), the spacing 416 is 2 μm (FIG. 4A), and the lengths 418-5 and 418-6 are each 34 μm (FIG. 4B).

These simulations confirm that $C_1$ 714 decreases more rapidly with increasing separation 712 than $C_2$ 716. When the semiconductor dies are close together (i.e., smaller values of the separation 712) $C_1$ 714 is greater than $C_2$ 716, and when the semiconductor dies are farther apart (i.e., larger values of the separation 712) $C_1$ 714 is less than $C_2$ 716. In the embodiment 700, at a crossover separation $Z_{crossover}$ 718 of 35 μm the difference in capacitance $\Delta C$ (defined as $C_2 - C_1$) changes sign. Therefore, the crossover separation $Z_{crossover}$ 718 for a given proximity-connector structure may be used to determine the separation between semiconductor dies. For example, in embodiments where the proximity connector 440 (FIG. 5) is a receiver, the separation may be determined when the signal on the proximity connector 440 changes from a '0' to a '1'. Note that in some embodiments the signals applied to the proximity connectors 410 and 412 (FIG. 5) are chosen such that the signal on the proximity connector changes sign when the separation equals $Z_{crossover}$ 718.

Figure 8:
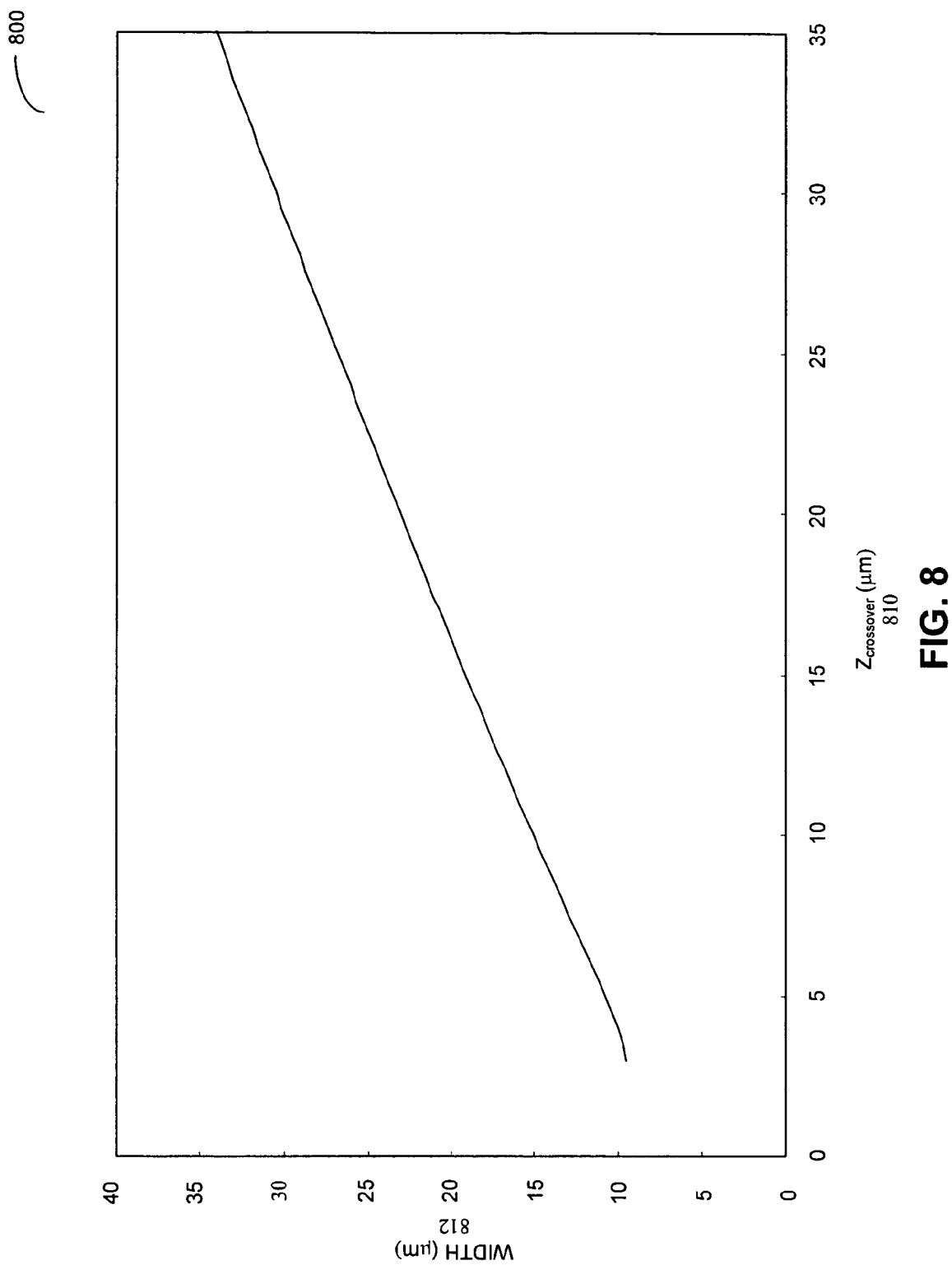
FIG. 8 is a block diagram illustrating a coupling-capacitance crossover separation as a function of width in a proximity-connector structure that facilitates determining misalignment in accordance with an embodiment of the present invention.

As noted previously, in some embodiments an arbitrary separation between semiconductor dies may be determined using multiple proximity-connector structures having different crossover separations. For example, proximity connectors having smaller areas have crossovers at smaller separations. Therefore, in some embodiments an array of proximity-connector structures spanning a range of separations (i.e., having a range of crossover separations) may be used. FIG. 8 provides a block diagram illustrating a coupling-capacitance crossover separation $Z_{crossover}$ 810 in μm as a function of width 812 in μm in a proximity-connector structure that facilitates determining misalignment in accordance with an embodiment 800 of the present invention. Note that the width 812 is that of the inner proximity connector and the outer proximity connector. In the context of the portion 400 (FIG. 4A) of the proximity-connector structure, the width 812 is the length 418-3 or 418-4 (FIG. 4A) and is half of the length 418-1 or 418-2 (FIG. 4A) minus the spacing 416 (FIG. 4A) and minus half the length 418-3 or 418-4 (FIG. 4A). Therefore, in these simulations, the widths 812 of these proximity connectors in the portion 400 are equal. Note that in these simulations the spacing 416 (FIG. 4A) is 2 μm. Furthermore, in context of the portion 430 (FIG. 4B) of the proximity-connector structure, the width 812 is also the length 418-5 or 418-6 (FIG. 4B).

Figure 9A:
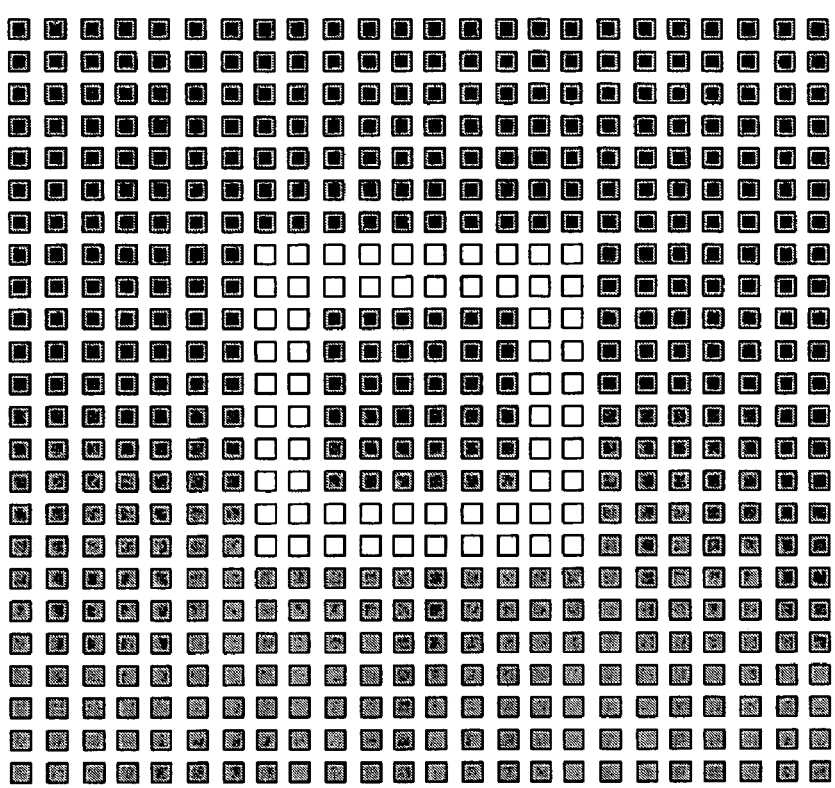
FIG. 9A is a block diagram illustrating a configurable proximity-connector structure that facilitates determining misalignment in accordance with an embodiment of the present invention.
Figure 9B:
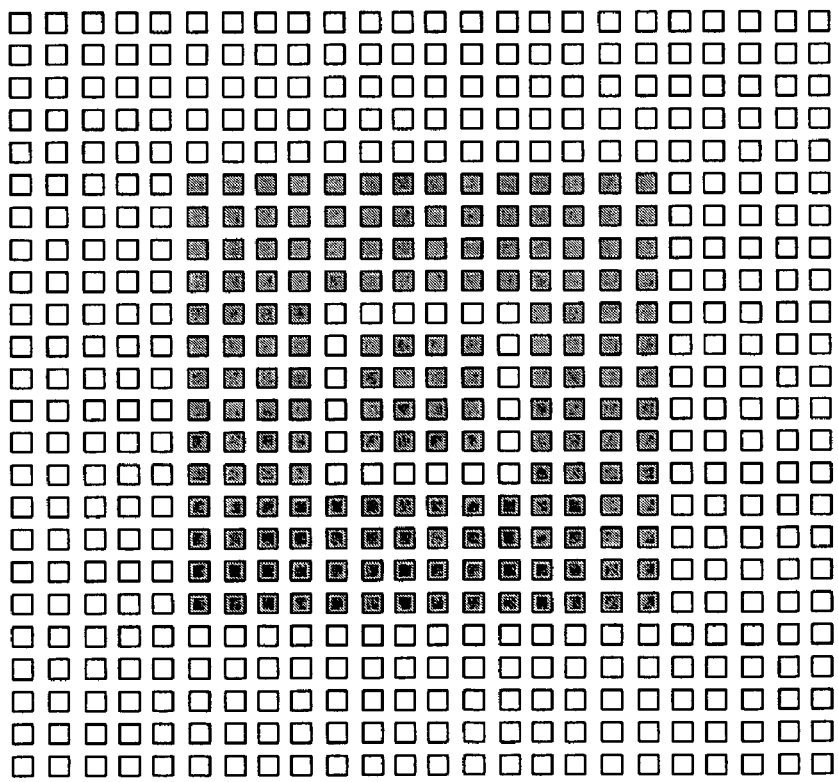
FIG. 9B is a block diagram illustrating a configurable proximity-connector structure that facilitates determining misalignment in accordance with an embodiment of the present invention.

As was also noted previously, in some embodiments an array of proximity connectors may be dynamically configured to define one or more proximity-connector structures. In particular, the effective area (and thus the crossover separation) of a given proximity-connector structure may be changed based on the proximity connectors that are included in the structure. This is illustrated in FIGS. 9A and 9B, which provide block diagrams illustrating configurable proximity-connector structures 900 and 950 that facilitate determining misalignment in accordance with embodiments of the present invention. In these proximity-connector structures 900 and 950, the darker-shaded micro-proximity connectors are used to define the inner and outer proximity connectors in the portion 400 of the proximity-connector structure (FIG. 4A). Similar configurations of micro-proximity connectors may be used to define different sized proximity connectors that correspond to the portion 430 of the proximity-connector structure (FIG. 4B). A method for using such a configurable array of proximity connectors is described further below with reference to FIG. 11.

To ensure that separations over a desired range can be measured the size of the micro-proximity connectors in the configurable array should ideally be comparable to the minimum separation to be measured. In addition, the size of the entire micro-proximity connector array (which is governed by the number of proximity connectors in the array) should ideally be comparable to the maximum separation to be measured. For example, to measure separations over a typical range from 2 to 10 μm, a configurable array of 30×30 micro-proximity connectors may be used. In this array, each of the micro-proximity connectors may be 1×1 μm².

In addition to facilitating determining of separation, the proximity-connector structures described above may facilitate determining a tilt angle, such as tilt angles 316 (FIGS. 3C and 3D), between semiconductor dies. In particular, the tilt angle of a given semiconductor die can be determined by measuring the separation between semiconductor dies at two different locations on the semiconductor die. If the two measured separations are $z_1$ and $z_2$, the tilt angle $\phi$ is given by $$\tan^{-1}\left(\frac{z_2 - z_1}{D}\right),$$

where D is the in-plane distance between the two measurement locations. For small values of $\phi$ this expression may be simplified as $$\frac{z_2 - z_1}{D}.$$

Figure 3A:
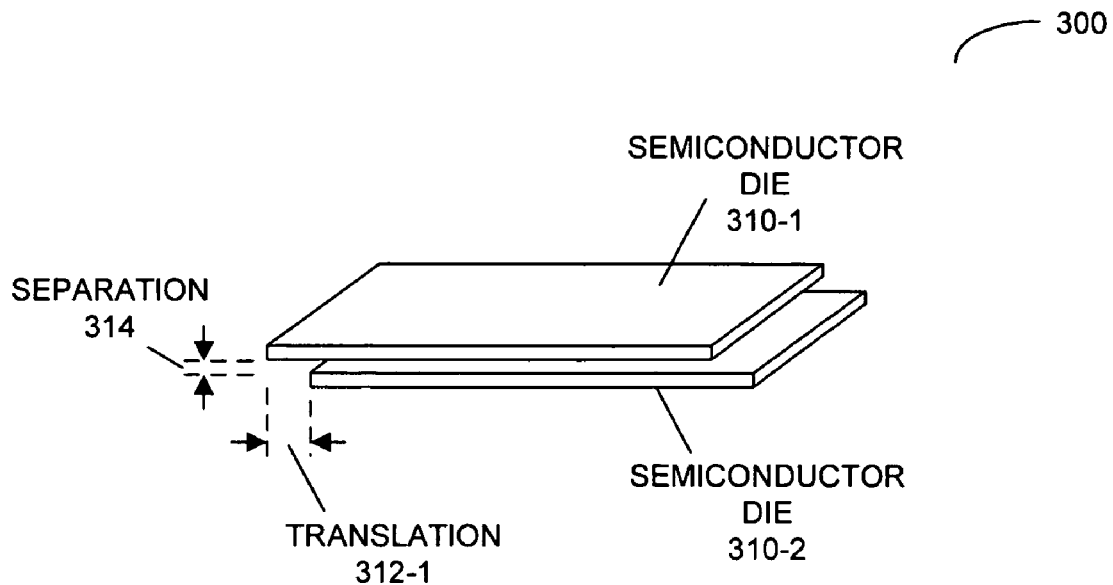
FIG. 3A is a block diagram illustrating misalignment between semiconductor dies in accordance with an embodiment of the present invention.
Figure 3B:
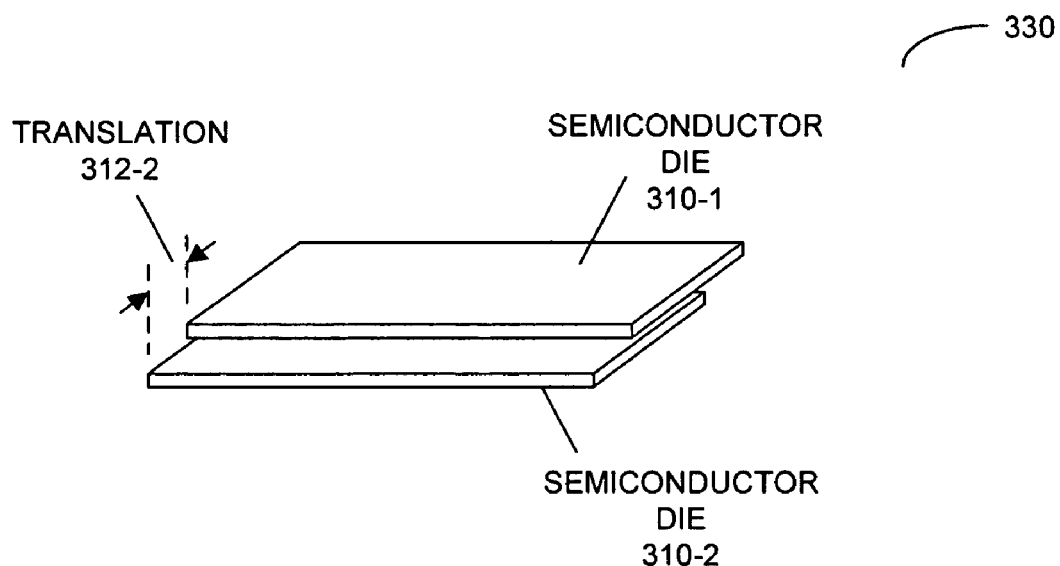
FIG. 3B is a block diagram illustrating misalignment between semiconductor dies in accordance with an embodiment of the present invention.
Figure 3C:
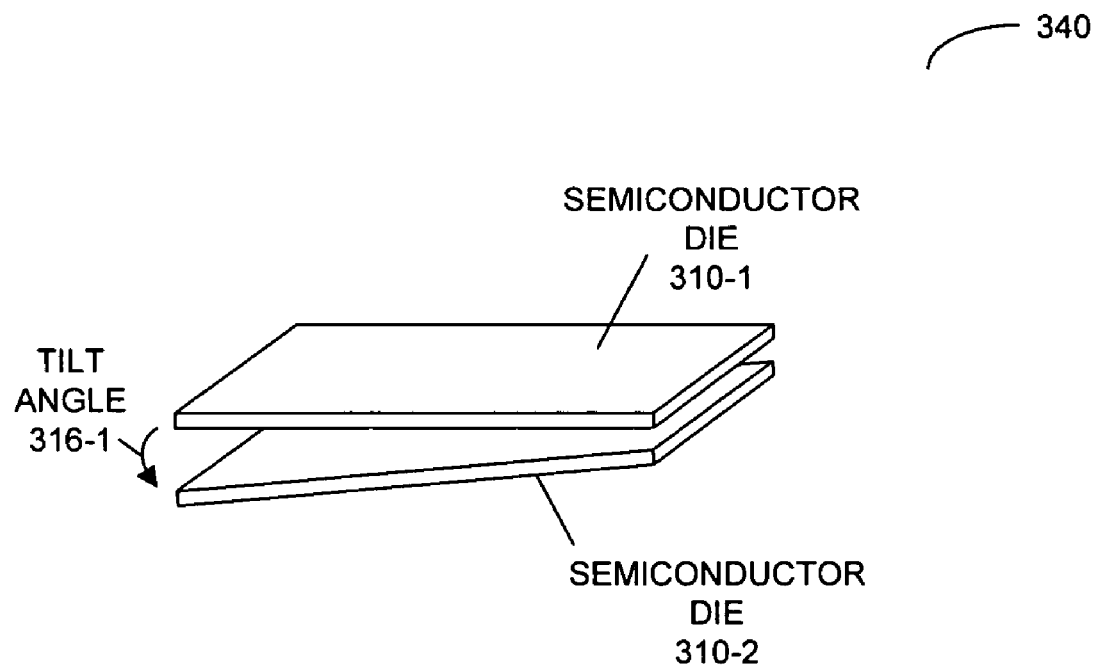
FIG. 3C is a block diagram illustrating misalignment between semiconductor dies in accordance with an embodiment of the present invention.
Figure 3D:
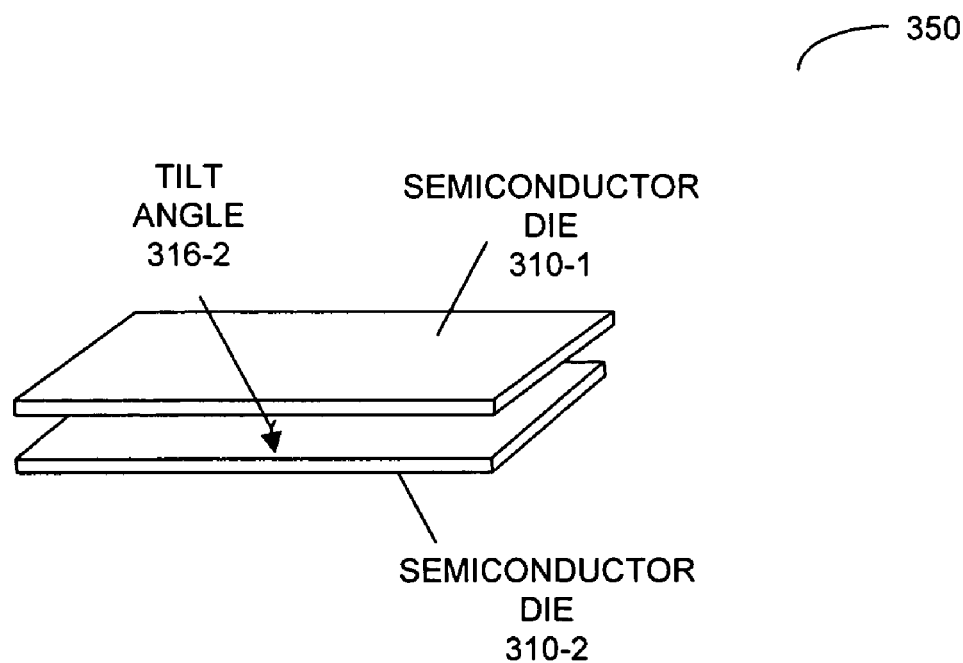
FIG. 3D is a block diagram illustrating misalignment between semiconductor dies in accordance with an embodiment of the present invention.
Figure 3E:
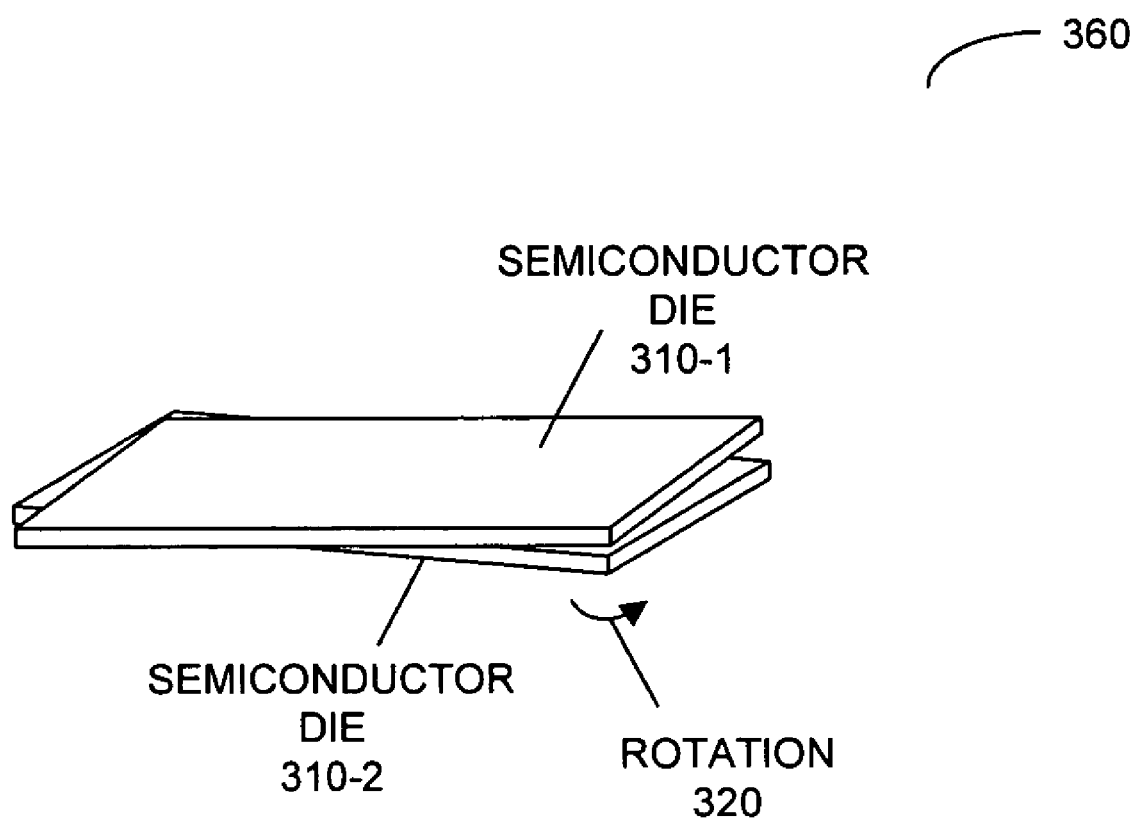
FIG. 3E is a block diagram illustrating misalignment between semiconductor dies in accordance with an embodiment of the present invention.
Figure 10:
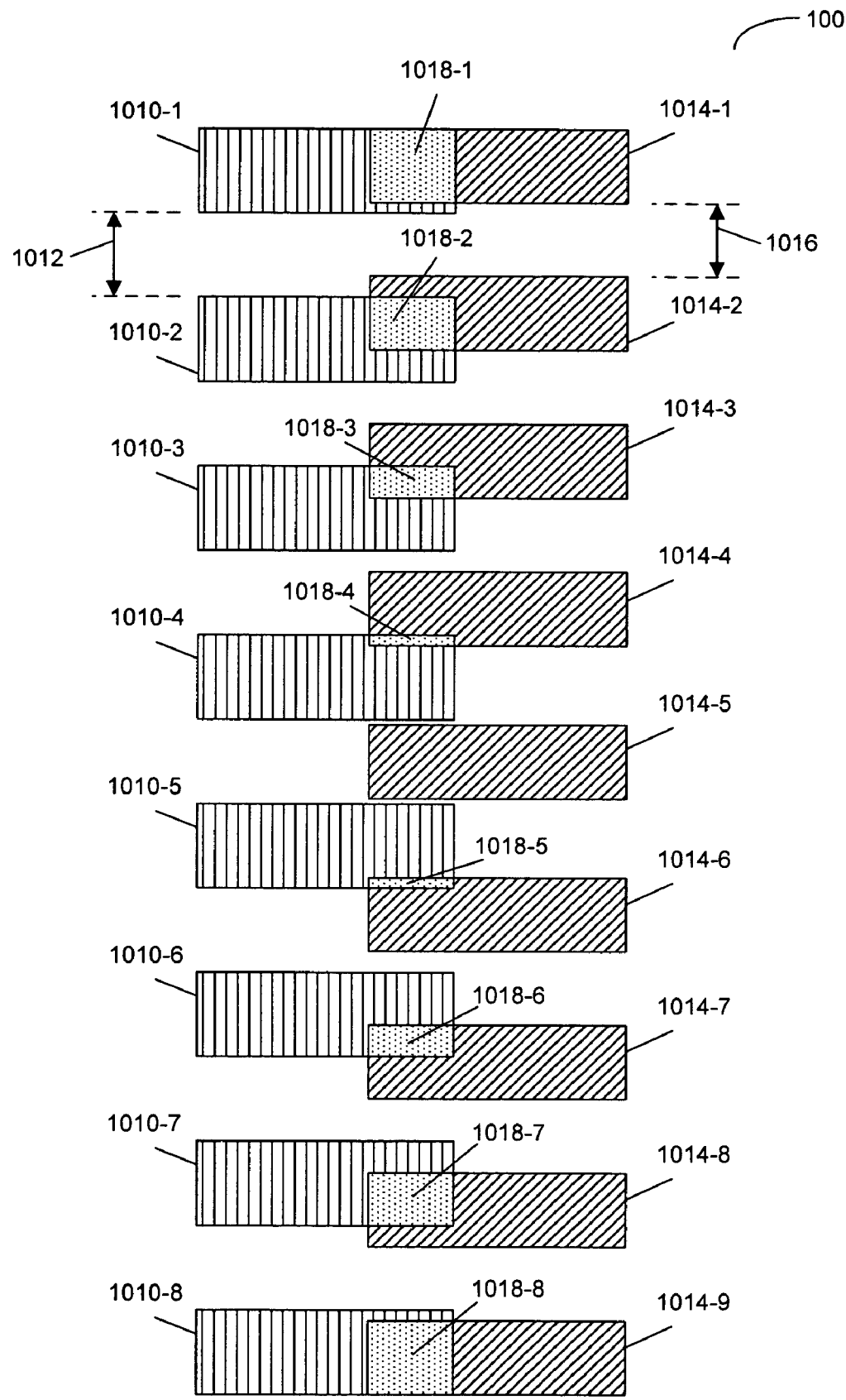
FIG. 10 is a block diagram illustrating a Vernier structure that facilitates determining misalignment in accordance with an embodiment of the present invention.

Other components of the misalignment between semiconductor dies may be measured using one or more Vernier structures. This is illustrated in FIG. 10, which provides a block diagram illustrating a Vernier structure 1000 that facilitates determining of misalignment in accordance with an embodiment of the present invention. In this approach, coupling capacitances between sets of proximity connectors 1010 and 1014 having different spacings 1012 and 1016 may be compared to facilitate determining one or more translations 312 (FIGS. 3A and 3B) and/or the rotation 320 (FIG. 3E). Note that the sets of proximity connectors 1010 and 1014 are on different semiconductor dies and the coupling capacitances are associated with the overlap 1018 of the proximity connectors which causes capacitive coupling between the proximity connectors.

In particular, if a signal pattern, such as '1010', is outputted on one set of proximity connectors 1010 or 1014, a slightly different signal pattern is received on the other set of proximity connectors. For example, a break or a removal of a bit occurs at a location in the sets of proximity connectors 1010 and 1014. This location may be used to determine the relative position of one of the semiconductor dies in one dimension. Note that by performing measurements using at least two orthogonally positioned Vernier structures, both of the translations 312 (FIGS. 3A and 3B) may be determined. Similarly, by performing translation measurements at two different locations on a given semiconductor die, the rotation 320 (FIG. 3E) may be determined. In particular, the rotation may be determined from the differences in translation at the two locations.

Figure 11:
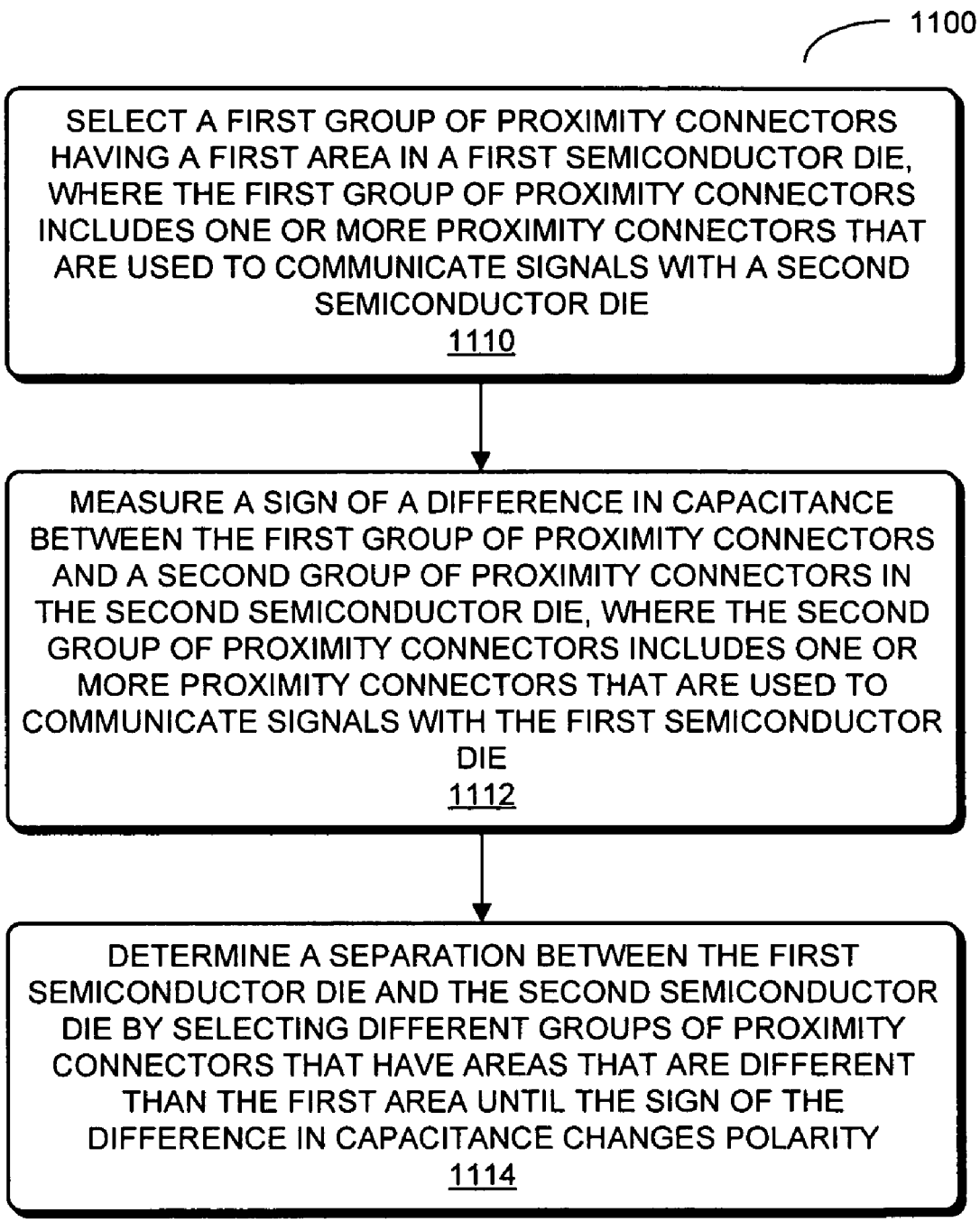
FIG. 11 is a flow chart illustrating a process for determining misalignment in accordance with an embodiment of the present invention.

We now discuss methods for determining misalignment between semiconductor dies. FIG. 11 is a flow chart illustrating a process 1100 for determining misalignment in accordance with an embodiment of the present invention. During this process, a first group of proximity connectors having a first area is selected in a first semiconductor die (1110). Note that the first group of proximity connectors includes one or more proximity connectors that are used to communicate signals with a second semiconductor die.

Then, a sign of a difference in capacitance between the first group of proximity connectors and a second group of proximity in the second semiconductor die is measured (1112). Note that the second group of proximity connectors includes one or more proximity connectors that are used to communicate signals with the first semiconductor die. Furthermore, a separation between the first semiconductor die and the second semiconductor die is determined by selecting different groups of proximity connectors that have areas that are different than the first area until the sign of the difference in capacitance changes polarity (1114). In some embodiments, there may be additional or fewer operations, the order of the operations may be changed, and two or more operations may be combined into a single operation.

Figure 12:
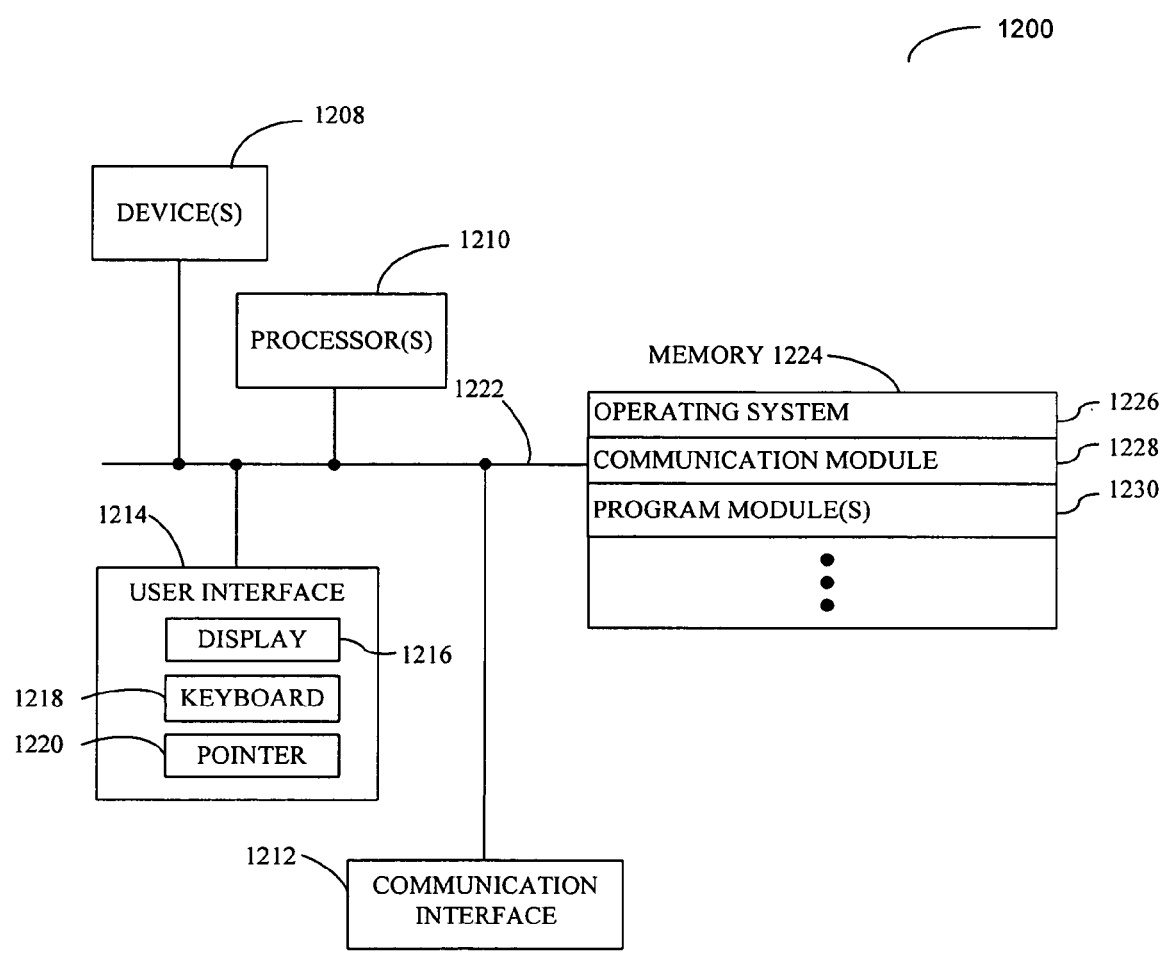
FIG. 12 is a block diagram illustrating a computer system in accordance with an embodiment of the present invention.

The present invention may include systems that contain one or more devices that include components (such as one or more semiconductor dies) that communicate signals using capacitively coupled proximity connectors. For example, FIG. 12 presents a block diagram illustrating a computer system 1200 in accordance with an embodiment of the present invention, which includes one or more processors 1210, a communication interface 1212, a user interface 1214, and one or more signal lines 1222 coupling these components together. Note that the one or more processing units 1210 may support parallel processing and/or multi-threaded operation, the communication interface 1212 may have a persistent communication connection, and the one or more signal lines 1222 may constitute a communication bus. Moreover, the user interface 1214 may include a display 1216, a keyboard 1218, and/or a pointer, such as a mouse 1220.

The computer system 1200 may include memory 1224, which may include high speed random access memory and/or non-volatile memory. More specifically, memory 1224 may include ROM, RAM, EPROM, EEPROM, FLASH, one or more smart cards, one or more magnetic disc storage devices, and/or one or more optical storage devices. Memory 1224 may store an operating system 1226, such as SOLARIS, LINUX, UNIX, OS X, or WINDOWS, that includes procedures (or a set of instructions) for handling various basic system services for performing hardware dependent tasks. The memory 1224 may also store procedures (or a set of instructions) in a communication module 1228. The communication procedures may be used for communicating with one or more computers and/or servers, including computers and/or servers that are remotely located with respect to the computer system 1200.

Memory 1224 may also include the one or more program modules (of sets of instructions) 1230. Instructions in the program modules 1230 in the memory 1224 may be implemented in a high-level procedural language, an object-oriented programming language, and/or in an assembly or machine language. The programming language may be compiled or interpreted, i.e, configurable or configured to be executed by the one or more processing units 1210.

The computer system 1200 may include one or more devices 1208 that include semiconductor dies that communicate using proximity communication as described in the previous embodiments.

The computer system 1200 may include fewer components or additional components, two or more components may be combined into a single component, and/or a position of one or more components may be changed. In some embodiments, the functionality of the computer system 1200 may be implemented more in hardware and less in software, or less in hardware and more in software, as is known in the art.

Although the computer system 1200 is illustrated as having a number of discrete items, FIG. 12 is intended to be a functional description of the various features that may be present in the computer system 1200 rather than as a structural schematic of the embodiments described herein. In practice, and as recognized by those of ordinary skill in the art, the functions of the computer system 1200 may be distributed over a large number of servers or computers, with various groups of the servers or computers performing particular subsets of the functions. In some embodiments, some or all of the functionality of the computer system 1200 may be implemented in one or more application specific integrated circuits (ASICs) and/or one or more digital signal processors (DSPs).

While the preceding embodiments have discussed the determination of one or more components of the misalignment between semiconductor dies, in other embodiments the invention may be applied to a wide variety of problems in which signals between two objects are capacitively coupled. For example, the preceding embodiments may be used to facilitate and/or determine misalignment between semiconductor dies and printed circuit boards.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A semiconductor die, comprising:
   proximity connectors proximate to a surface of the semiconductor die,
   wherein the semiconductor die is configured to communicate signals with a second semiconductor die via proximity communication through one or more of the proximity connectors;
   wherein the proximity connectors include a first group of proximity connectors that is configured to facilitate determining a first separation between the semiconductor die and the second semiconductor die by comparing coupling capacitances between the first group of proximity connectors and proximity connectors of the second semiconductor die;

wherein the first group of proximity connectors includes a first proximity connector and a second proximity connector; and wherein the second proximity connector at least partially encloses an in-plane outer edge of the first proximity connector.

2. The semiconductor die of claim 1, wherein the first proximity connector and the second proximity connector are separated by a guard band.

3. The semiconductor die of claim 1, wherein the first group of proximity connectors are configured to transmit communication signals.

4. The semiconductor die of claim 1, wherein the first group of proximity connectors are configured to receive communication signals.

5. The semiconductor die of claim 1, wherein the first separation is determined based on a difference in capacitance between a first capacitance associated with the first proximity connector and a second capacitance associated with the second proximity connector.

6. The semiconductor die of claim 5, wherein the first separation is determined based on a sign of the difference in capacitance.

7. The semiconductor die of claim 1, wherein the first proximity connector is in a first plane and the second proximity connector is in a second plane.

8. The semiconductor die of claim 1, wherein the first proximity connector has a first area and the second proximity connector has a second area.

9. The semiconductor die of claim 1, wherein the first proximity connector is associated with a first dielectric in the semiconductor die and the second proximity connector is associated with a second dielectric in the semiconductor die.

10. The semiconductor die of claim 1, wherein the semiconductor die is configured to dynamically select the first group of proximity connectors from the proximity connectors.

11. The semiconductor die of claim 10, wherein the first proximity connector and the second proximity connector are dynamically selected from the first group of proximity connectors to have an area corresponding to the first separation, thereby facilitating determining of the separation.

12. The semiconductor die of claim 1, wherein an area of the first group of proximity connectors corresponds to the first separation.

13. The semiconductor die of claim 1, wherein the proximity connectors include a second group of proximity connectors;

wherein the second group of proximity connectors is configured to facilitate determining a second separation between the semiconductor die and the second semiconductor die by comparing coupling capacitances between the second group of proximity connectors and proximity connectors of the second semiconductor die;

wherein the second group of proximity connectors includes a third proximity connector and a fourth proximity connector; and wherein the fourth proximity connector at least partially encloses an in-plane outer edge of the third proximity connector.

14. The semiconductor die of claim 13, wherein the first separation is in a first range of values and the second separation is in a second range of values.

15. The semiconductor die of claim 13, wherein a tilt angle of the semiconductor die is determined based on the first separation and the second separation.

16. The semiconductor die of claim 1, wherein the second proximity connector has a ring shape; and wherein an in-plane inner edge associated with the ring shape encloses the in-plane outer edge of the first proximity connector.

17. The semiconductor die of claim 1, wherein a subset of the proximity connectors are configured to facilitate determining translation of the semiconductor die with respect to the other semiconductor die.

18. The semiconductor die of claim 1, wherein a subset of the proximity connectors are configured to facilitate determining a rotation of the semiconductor die with respect to the other semiconductor die.

19. A system, comprising:
a first semiconductor die; and
a second semiconductor die,
wherein the first semiconductor die includes a first set of proximity connectors proximate to a first surface of the first semiconductor die and is configured to communicate signals with the second semiconductor die via proximity communication through the first set of proximity connectors;

wherein the second semiconductor die includes a second set of proximity connectors proximate to a second surface of the second semiconductor die and is configured to communicate signals with the first semiconductor die via proximity communication through the second set of proximity connectors;

wherein a first group of proximity connectors in the first set of proximity connectors is configured to facilitate determining a first separation between the first semiconductor die and the second semiconductor die by comparing coupling capacitances between the first group of proximity connectors and the second set of proximity connectors;

wherein the first group of proximity connectors includes a first proximity connector and a second proximity connector; and wherein the second proximity connector at least partially encloses an in-plane outer edge of the first proximity connector.

\* \* \* \* \*

UNITED STATES PATENT AND TRADEMARK OFFICE
CERTIFICATE OF CORRECTION

PATENT NO. : 7,649,255 B2
APPLICATION NO. : 11/635336
DATED : January 19, 2010
INVENTOR(S) : Chow et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 344 days.

Signed and Sealed this

Twenty-third Day of November, 2010

David J. Kappos
*Director of the United States Patent and Trademark Office*